(12) United States Patent
Larsen et al.

(10) Patent No.: US 12,089,379 B2
(45) Date of Patent: Sep. 10, 2024

(54) HEAT TRANSFER ASSEMBLY AND POWER ELECTRONICS DEVICE

(71) Applicant: BITZER Electronics A/S, Sønderborg (DK)

(72) Inventors: Lasse Christian Larsen, Sønderborg (DK); Torben Nielsen, Sydals (DK)

(73) Assignee: BITZER Electronics A/S, Sønderborg (DK)

( * ) Notice: Subject to any disclaimer, the term of this patent is extended or adjusted under 35 U.S.C. 154(b) by 238 days.

(21) Appl. No.: 17/372,244

(22) Filed: Jul. 9, 2021

(65) Prior Publication Data

US 2021/0337698 A1 Oct. 28, 2021

Related U.S. Application Data

(63) Continuation of application No. PCT/EP2019/051228, filed on Jan. 18, 2019.

(51) Int. Cl.
*H05K 7/20* (2006.01)

(52) U.S. Cl.
CPC ......... *H05K 7/209* (2013.01); *H05K 7/20209* (2013.01); *H05K 7/20909* (2013.01)

(58) Field of Classification Search
None
See application file for complete search history.

(56) References Cited

U.S. PATENT DOCUMENTS

| | | | | |
|---|---|---|---|---|
| 5,424,915 A | * | 6/1995 | Katooka | H05K 7/20909 361/695 |
| 5,793,608 A | * | 8/1998 | Winick | H01L 23/467 257/E23.099 |
| 7,218,517 B2 | * | 5/2007 | Wolford | H05K 1/0272 361/720 |
| 7,248,471 B2 | * | 7/2007 | Wabiszczewicz | H05K 7/20154 361/695 |

(Continued)

FOREIGN PATENT DOCUMENTS

| | | |
|---|---|---|
| CN | 104303412 A | 1/2015 |
| EP | 0356991 A2 | 3/1990 |

(Continued)

*Primary Examiner* — Courtney L Smith
(74) *Attorney, Agent, or Firm* — Reinhart Boerner Van Deuren P.C.

(57) ABSTRACT

The invention refers to a heat transfer assembly for cooling an electronic power circuitry, said heat transfer assembly comprising a base member and at least one electronic power component in heat conductive contact for transferring heat to said base member, a heat transfer chamber adjoining said base member and being provided with fins extending from said base member into said heat transfer chamber for transferring heat to a flow of cooling medium extending through said heat transfer chamber and passing through spaces between said fins, said heat transfer assembly is designed such that said flow of cooling medium comprising an environment induced flow extending through said heat transfer chamber and entering said heat transfer chamber with (Continued)

respect to the direction of gravity in a lower section thereof and exiting from said heat transfer chamber with respect to said direction of gravity from an upper section thereof.

39 Claims, 11 Drawing Sheets

(56) References Cited

U.S. PATENT DOCUMENTS

| | | | | |
|---|---|---|---|---|
| 7,885,062 | B2 * | 2/2011 | Wagner | H05K 7/20727 |
| | | | | 361/679.49 |
| 7,929,301 | B2 * | 4/2011 | Fong | H05K 5/063 |
| | | | | 363/141 |
| 8,363,408 | B2 * | 1/2013 | Zheng | H05K 7/20918 |
| | | | | 257/722 |
| 8,379,384 | B2 * | 2/2013 | Smalen | H05K 7/20909 |
| | | | | 312/236 |
| 8,520,381 | B2 * | 8/2013 | Hobein | H05K 7/20918 |
| | | | | 361/752 |
| 9,192,079 | B2 * | 11/2015 | Loth | H05K 7/20918 |
| 9,648,779 | B2 * | 5/2017 | Kohn | H01L 23/467 |
| 10,462,939 | B2 * | 10/2019 | Ushijima | F28F 9/026 |
| 11,502,023 | B2 * | 11/2022 | Ushijima | H05K 7/20254 |
| 2008/0117589 | A1 * | 5/2008 | Carrera | G06F 1/20 |
| | | | | 165/59 |

FOREIGN PATENT DOCUMENTS

| | | |
|---|---|---|
| EP | 2879476 A1 | 6/2015 |
| EP | 2890227 A1 | 7/2015 |
| JP | H10295087 A | 11/1998 |
| JP | 2013-093364 A | 5/2013 |
| WO | 2012/158304 A1 | 11/2012 |

* cited by examiner

HEAT TRANSFER ASSEMBLY AND POWER ELECTRONICS DEVICE

CROSS-REFERENCE TO RELATED PATENT APPLICATION

This patent application claims the benefit of PCT-application No. PCT/EP2019/051228, filed Jan. 18, 2019, the teachings and disclosure of which are hereby incorporated in their entirety by reference thereto.

BACKGROUND OF THE INVENTION

The invention refers to a heat transfer assembly for cooling an electronic power circuitry, said heat transfer assembly comprising a base member and at least one electronic power component in heat conductive contact for transferring heat to said base member, a heat transfer chamber adjoining said base member and being provided with fins extending from said base member into said heat transfer chamber for transferring heat to a flow of cooling medium extending through said heat transfer chamber and passing through spaces between said fins.

Such a heat transfer assembly is known from WO 2012/158304 A1.

It is the object of the present invention to provide a heat transfer assembly which is operating more power efficient than the known heat transfer assembly which permanently needs a fan to provide cooling medium to that heat transfer chamber.

SUMMARY OF THE INVENTION

This object is solved by a heat transfer assembly as mentioned before wherein according to the present invention said heat transfer assembly is designed such that said flow of cooling medium comprises an environment induced flow extending through said heat transfer chamber and entering said heat transfer chamber with respect to the direction of gravity in a lower section thereof and exiting from said heat transfer chamber with respect to said direction of gravity from an upper section thereof and wherein said heat transfer assembly is designed such that said flow of cooling medium can be supplemented by a fan induced flow extending through said heat transfer chamber and entering said heat transfer chamber in a section different from said section of entering of said environment induced flow.

The advantage of the present invention is that the environment induced flow is less energy consuming and therefore more cost efficient than a fan induced flow so that for example even use of the environment induced flow in combination with the fan induced flow is more cost efficient or so that for example the fan induced airflow can be only used in case said heat transfer assembly is operating with a high thermal load, e.g. a high level of heat generated and therefore to be transferred, whereas in cases said heat transfer assembly is operating only with medium or low thermal load the environment induced flow in such cases is sufficient for removing the heat transferred by said heat transfer assembly.

The inventive concept is in particular of advantage in case of running a compressor of a refrigeration system because said compressor is usually only running with high load in case of a freezing mode whereas in case of a temperature maintaining mode the compressor usually presents a low load for said power component.

The term environment induced flow defines that said flow can be generated by any environmental conditions of said heat transfer assembly contributing to said flow, which means conditions such as lower environmental temperature which will generate an environment induced flow due to the chimney effect and/or any external flow generated by external devices or relative wind or heat wind.

The term electronic power component defines any electronic or electric component generating heat due to being subject to electric power.

It is in particular of advantage if said environment induced flow in said heat transfer chamber has a flow component opposite to the direction of gravity—in particular permanently has a flow component opposite to the direction of gravity—so that the chimney effect can be used in order to maintain that environment induced flow through said heat transfer chamber.

For improving the heat transfer it is of advantage if said environment induced flow is guided by said fins in a direction deviating from the direction of gravity so that redirecting said environment induced flow by said fins improves the heat transfer from said fins to the environment induced flow.

Further it is of advantage for the heat transfer if said environment induced flow extends along longitudinal sides of said fins in order to have extended surfaces for heat transfer from said fins to said environment induced flow.

With respect to the design of the fins no further details have been given so far. It is of advantage if said fins extend from said base member in a height direction and with their longitudinal sides have an extension in a direction transverse to said height direction which is greater than a thickness of said fins, said thickness of the finds being in particular defined by the distance between said longitudinal sides of said fins.

Said heat exchange between said fins and said environment induced flow can be further improved if said fins are arranged at a distance with respect to each other transverse to said longitudinal sides thereof for forming longitudinal flow channels extending parallel to said longitudinal sides of said fins.

In particular, such a longitudinal flow along said longitudinal sides of said fins extends in a direction which is inclined with the direction of gravity.

Further, it is of advantage if said fins are arranged in said heat transfer chamber to define transverse flow channels extending transverse to the longitudinal channels.

Further it is of advantage if said fins in direction parallel to their longitudinal sides are arranged at distances with respect to each other, in particular for enabling the formation of said transverse flow channels.

An advantageous design provides that said fins are aligned in first rows extending parallel to each other, so that each of said parallel rows is comprising a plurality of fins.

Further it is of advantage if said fins are aligned in second rows extending parallel to each other and transverse to said first rows so that also each second row is provided with a plurality of fins.

It is of particular advantage if said fins are arranged at the crossings between said first rows and said second rows.

The arrangement of said rows enables an advantageous arrangement of said fins wherein said first and second rows define first and second transverse channels between said fins, which first and second transverse channels enable separation of said fins in order to distribute the flow through said arrangement of fins throughout the heat transfer chamber.

Further it is of advantage if said fins with their longitudinal sides extend transverse to said first and second rows so that a flow extending along said first and/or said second rows is redirected when it hits a longitudinal side of a fin.

Therefore, it is of particular advantage if said first and second transverse channel distribute the flow between said longitudinal channels in order to use the entire volume of the heat transfer chamber for heat exchange with said environment induced flow and said fan induced flow.

With respect to the design of the fins itself no details have been given so far.

An advantageous solution provides that an extension of the longitudinal sides of said fins corresponds to values in the range starting from the thickness to five times the thickness of said fins so that the longitudinal sides provide sufficient surface areas for heat exchange.

Further, for improving the heat exchange between said fins and said environment induced flow it is provided that said environment induced flow enters said heat transfer chamber in a first flow direction extending at an acute angle to said longitudinal sides of said fins.

A further advantageous solution provides that said fan induced flow enters said heat transfer chamber in a second inflow direction extending at an acute angle to said longitudinal sides of said fins which in particular is different from said acute angle between said first inflow direction and said longitudinal sides of said fins.

In particular it is of advantage if the first inflow direction and the second inflow direction extend transverse to each other.

In order to optimize the orientation of said longitudinal sides of said fins with respect to said first inflow direction and said second inflow direction it is provided that said longitudinal sides of said fins extend between said first inflow direction and said second inflow direction.

In particular, said fins are oriented so as to direct said environment induced flow in said longitudinal channels and said transverse channels in particular said fins are oriented so as to guide said fan induced inflow into said longitudinal channel and said transverse channels.

In general said fins could be arranged with their longitudinal sides in slightly different orientation.

However, for avoiding too many turbulences it is of advantage if a majority of fins has essentially the same orientation of their longitudinal sides. However it could be possible if said longitudinal sides of said fins deviate from a parallel orientation by angles in the range from 0° to 20° or better in the range from 0° to 10°.

In connection with the designs the features of the heat transfer assembly disclosed before nothing has been defined with respect to the limitation of said heat transfer chamber.

An advantageous solution provides that the heat transfer assembly comprises sidewalls limiting said heat transfer chamber and extending from said base member.

In particular, said sidewalls are designed such that they form a first inflow opening of said heat transfer chamber for said environment induced flow.

Further, another advantageous solution provides that said heat transfer assembly comprises sidewalls forming a second inflow opening of said heat transfer chamber for said fan induced flow.

In order to provide an optimized heat transfer said base member and said fins and in particular also said side walls of said heat transfer chamber are made of a material having a good thermal conductivity such as a metal, in particular aluminum or a material having a thermal conductivity similar to aluminum.

In a preferred embodiment said base member and said fins and in particular also said sidewalls are made in one piece.

In connection with the solutions defined before no specific details are given with respect to the thermal connection between the at least one power component and the base member.

An advantageous solution provides that said at least one power component is thermally connected to the base member on a side opposite to said heat transfer chamber so that the heat generated in said power component can be easily and efficiently transferred to the base member and further easily and efficiently transferred from the base member to the fins arranged in said heat transfer chamber.

It is of particular advantage if at least one power component is thermally connected to an area of said base member opposite to a first chamber section of said heat transfer chamber.

The heat transfer can be further optimized if another power component is thermally connected to an area of said base member opposite to a second chamber section of said heat transfer chamber.

In particular, said power component thermally connected to said area of the base member opposite to said first chamber section is the power component generating an amount of heat different from the amount of heat generated by the power component connected to an area of said base member opposite to the second chamber section.

In particular, in such a design it is of advantage if said first chamber section of said heat transfer chamber is first hit by said environment induced flow and/or said fan induced flow so that the amount of heat to be transferred in said first chamber section is the highest amount and the power component connected thereto is the one generating the highest amount of heat.

Further it is of advantage if said second chamber section of said heat transfer chamber is hit by said environment induced flow and/or said fan induced flow after having passed said first chamber section so that the flows can further remove heat from said second chamber section to an amount which is lower than the amount of heat transferred in said first chamber section. This is in particular sufficient due to the fact that the amount of heat to be transferred in said second chamber section from the power component connected thereto is for example lower than the heat to be transferred in that first transfer section.

In connection with the various embodiments explained so far no further explanations are given to the generation of the fan induced flow.

In order to generate the fan induced flow it is of advantage if said heat transfer assembly comprises a fan receptacle receiving a fan.

Further it is of advantage if said heat transfer assembly comprises duct walls extending from said base member and forming a flow duct extending from said receptacle to said inflow opening of said heat transfer chamber for said fan induced flow.

This design enables in a simple manner on one hand to generate the fan induced flow and on the other hand to specifically guide the fan induced flow to said heat transfer chamber.

In principle it would be possible to arrange said heat transfer chamber such that it is closed on the side opposite to said base member so that the heat transfer chamber is only open at inflow openings and outflow openings.

However, a very simple design provides said heat transfer chamber is open on a side opposite to said base member.

Further it is of advantage in such a concept if said flow duct is open to a side opposite to said base member.

Further it is of advantage if said heat transfer assembly with said side walls of said heat transfer chamber and said duct walls of said flow duct extends to a common geometric surface arranged opposite said base member.

In particular in such a case where the heat transfer chamber is open to a side opposite to said base member said heat transfer assembly is adapted to be mounted on a mounting surface, for example a mounting surface of a wall, with a geometric surface abutting said mounting surface so that the mounting surface provides for closure of said heat transfer chamber and/or said flow duct on the side opposite to said base member.

With respect to the fins extending in said heat transfer chamber it is also of advantage if said fins extend at maximum to said geometric surface so that the fins can be designed to have an optimized surface for heat transfer without effecting proper mounting of said heat transfer assembly on said mounting surface.

In connection with the advantages of the present invention it has been explained that the generation of the fan induced flow can depend on the load of the at least one power component.

It is therefore of particular advantage if said flow of cooling medium through said heat transfer chamber comprises a permanent environment induced flow and a need controlled fan induced flow, which means that the generation of the fan induced flow depends on whether it is needed for removing sufficient heat from said heat transfer chamber or whether it is not needed so that the energy for operating the fan can be saved in cases the heat can be removed from said heat transfer chamber only by the environment induced flow.

In order to properly control said fan induced flow an advantageous solution provides that said fan is controlled by a fan controller detecting the temperature at the at least one power component, in particular the power component with the highest heat generation, and activating said fan depending on the temperature detected, for example if a predefined value is exceeded.

This means that up to the predefined temperature value heat is removed from said heat transfer chamber only by the environment induced flow whereas a temperatures above said predefined temperature the heat is removed from said heat transfer chamber by said environment induced flow supported by said fan induced flow.

However, the fan controller can also operate by operating the fan at various power levels in order to generate a fan induced flow with various flow levels corresponding to various temperature ranges with the lowest flow level corresponding to the lowest temperature range and the highest flow level corresponding to the highest temperature range.

Another solution to operate a controller would also be to operate the fan, in particular the amount of flow generated by said fan, depending on the temperature detected so that there is a continuous variation of the amount of flow depending on the temperature level.

The invention also refers to a power electronics device, in particular a variable frequency drive, comprising a housing, an electronic power circuitry with at least one power component arranged in said housing, said housing comprising a bottom member provided with a heat transfer assembly for a said at least one power component and a cover member, said bottom member and said cover member being connected to each other and enclosing a circuitry receptacle receiving said electronic power circuitry with said at least one power component.

The advantage of this kind of power electronic device is that said electronic power circuitry is enclosed in a housing and that part of the housing is provided with a heat transfer assembly for removing heat generated by said at least one power component.

An advantageous embodiment of such a power electronic device provides that said bottom member and said cover member enclose a junction receptacle with electric junctions arranged therein.

Said junction receptacle being in particular separate from said circuitry receptacle so that providing said electric junctions can be done safe.

It is further of a specific advantage if said cover member comprises an access cover removable from said cover member and enabling access to said junction receptacle so that there is a specific separate access to said junction receptacle possible while said circuitry receptacle is not accessible in order to provide optimum safety when establishing the electric junctions to the various electric lines.

An advantageous solution provides that said access cover is releasably connected to said housing in particular to said bottom member.

It is of particular advantage if said access cover covers an access opening provided in said cover member, said access opening adjoining said junction receptacle so that there is easy access possible to said junction receptacle.

In connection with defining various features of said power electronics device no details of said heat transfer assembly have been given so far.

It is of particular advantage if one of said embodiments of said power electronics device as defined before comprises a heat transfer assembly which is designed according to the features of at least one of the embodiments of the heat transfer assembly as explained before.

The invention also refers to a cooling circuit comprising a low pressure section in which a heat absorbing heat exchanger is arranged and a high pressure section in which a heat releasing heat exchanger is arranged and a variable speed compressor unit driven by a power electronics device according to one or more of the embodiments described before.

The invention further refers to a method for cooling an electronic power circuitry by a heat transfer assembly comprising a base member and at least one electronic power component in heat conductive contact therewith for transferring heat to said base member, providing a heat transfer chamber adjoining said base member and being provided with fins extending from said base member into said heat transfer chamber for transferring heat, providing a flow of cooling medium extending through said heat transfer chamber and passing through spaces between said fins for receiving heat, providing said flow of cooling medium to comprise an environment induced flow extending through said heat transfer chamber and entering said heat transfer chamber with respect to the direction of gravity in a lower section thereof and exiting from said heat transfer chamber with respect to said direction of gravity from an upper section thereof, and providing said flow of cooling medium with a fan induced flow extending through said heat transfer chamber and entering said heat transfer chamber in a section different from said section of entering of said environment induced flow if necessary.

It is of advantage if said flow of cooling medium through said heat transfer chamber is provided with a permanent environment induced flow and a need controlled fan induced flow.

Further it is of advantage if a fan providing said fan induced flow is controlled by a fan controller detecting the temperature at the at least one power component and activating said fan depending on the temperature detected.

The solutions in accordance with the present invention comprise, in particular, the combinations of features defined by the following embodiments numbered consecutively.

1. A Heat transfer assembly (230) for cooling an electronic power circuitry (142) said heat transfer assembly (230) comprising a base member (144) and at least one electronic power component (184) in heat conductive contact for transferring heat to said base member (144), a heat transfer chamber (232) adjoining said base member (144) and being provided with fins (234) extending from said base member (144) into said heat transfer chamber (232) for transferring heat to a flow of cooling medium, extending through said heat transfer chamber (232) and passing through spaces between said fins (234), said heat transfer assembly is designed such that said flow of cooling medium comprising an environment induced flow (244) extending through said heat transfer chamber (232) and entering said heat transfer chamber (232) with respect to the direction of gravity (250) in a lower section (242) thereof and exiting from said heat transfer chamber (232) with respect to said direction of gravity (250) from an upper section (246, 248) thereof and said heat transfer assembly is designed such that said flow of cooling medium can be supplemented by a fan induced flow (264) extending through said heat transfer chamber (232) and entering said heat transfer chamber (232) in a section (262) different from said section (242) of entering of said environment induced flow (244).

2. Heat transfer assembly according to embodiment 1, wherein said environment induced flow (244) in said heat transfer chamber (232) has a flow component opposite to the direction of gravity (250).

3. Heat transfer assembly according to embodiment 1 or 2, wherein said environment induced flow (244) is guided by said fins (234) in a direction deviating from the direction of gravity (250).

4. Heat transfer assembly according to one of the preceding embodiments, wherein said environment induced flow (244) extends along a longitudinal side (314, 316) of said fins (234).

5. Heat transfer assembly according to one of the preceding embodiments, wherein said fins (234) extend from said base member (144) in an height direction (318) and extend with their longitudinal sides (314, 316) have an extension in a direction (318) transverse to said height direction which is greater than a thickness of said fins (234).

6. Heat transfer assembly according to one of the preceding embodiments wherein said fins (234) are arranged at distance with respect to each other transverse to said longitudinal sides (314, 316) thereof for forming longitudinal flow channels (332) extending parallel to said longitudinal sides (314, 316) of said fins (234).

7. Heat transfer assembly according to one of the preceding embodiments, wherein said fins (234) are arranged in said heat transfer chamber (232) to define transverse flow channels (334, 335, 336) extending transverse to the longitudinal flow channels (332).

8. Heat transfer assembly according to one of the preceding embodiments, wherein said fins (234) in directions parallel to their longitudinal sides (314, 316) are arranged at distances with respect to each other.

9. Heat transfer assembly according to one of the preceding embodiments, wherein said fins (234) are aligned in first rows (310, 311) extending essentially parallel to each other.

10. Heat transfer assembly according to one of the preceding embodiments, wherein said fins (234) are aligned in second rows (312, 313) extending essentially parallel to each other and transverse to said first rows (310, 311).

11. Heat transfer assembly according to one of the preceding embodiments, wherein said first and second rows (310, 312) define first (334, 335) and second (336, 337) transverse channels between said fins (234).

12. Heat transfer assembly according to one of the preceding embodiments, wherein said first (334, 335) and second (336, 337) transverse channels (334, 335, 336, 337) distribute the flow between said longitudinal channels (332).

13. Heat transfer assembly according to one of the preceding embodiments, wherein said fins (234) with their longitudinal sides (314, 316) extend transverse to said first and second rows (310, 311, 312, 313).

14. Heat transfer assembly according to one of the preceding embodiments, wherein an extension of the longitudinal sides (314, 316) said fins (234) corresponds to values in a range starting thickness to five times the thickness of said fins (234).

15. Heat transfer assembly according to one of the preceding embodiments, wherein said environment induced flow (244) enters said heat transfer chamber (232) in a first inflow direction (344) extending at an acute angle to said longitudinal sides (314, 316) of said fins (234).

16. Heat transfer assembly according to one of the preceding embodiments, wherein said fan introduced flow (264) enters said heat transfer chamber (232) in a second inflow direction (364) extending at an acute angle to said longitudinal sides (314, 316) of said fins (234) which is in particular different from said angle of said first inflow direction.

17. Heat transfer assembly according to one of the preceding embodiments, wherein the first inflow direction (344) and the second inflow direction (364) extend transverse to each other.

18. Heat transfer assembly according to embodiment 17, wherein said longitudinal sides (314, 316) of said fins (234) extend between said first inflow direction (344) and said second inflow (364) direction.

19. Heat transfer assembly according to one of the preceding embodiments, wherein said fins (234) are oriented so as to direct said environment induced flow (244) in said longitudinal channels (332, 333) and said transverse channels (334, 335, 336, 337).

20. Heat transfer assembly according to one of the preceding embodiments, wherein said fins (234) are oriented so as to guide said fan induced inflow (264) into said longitudinal channel (332, 333) and said transverse channels (334, 335, 336, 337).

21. Heat transfer assembly according to one of the preceding embodiments, wherein a majority of (234) fins has essentially the same orientation of their longitudinal sides (314, 316).

22. Heat transfer assembly according to one of the preceding embodiments, wherein said longitudinal sides (314, 316) of said fins (234) deviate from a parallel orientation by angles in the range from 0 degree to 20 degree or better from 0 degree to 10 degree.

23. Heat transfer assembly according to one of the preceding embodiments, wherein said heat transfer assembly (230) comprises side walls (236, 238, 276, 278) limiting said heat transfer chamber (232) and extending from said base member (144).

24. Heat transfer assembly according to one of the preceding embodiments, wherein said sidewalls (236, 238)

form a first inflow opening (242) of said heat transfer chamber (232) for said gravity included flow (244).

25 Heat transfer assembly according to one of the preceding embodiments, wherein said heat transfer assembly (230) comprises sidewalls (276, 278) forming a second inflow opening (262) of said heat transfer chamber (232) for said fan included flow (264).

26. Heat transfer assembly according to one of the preceding embodiments, wherein said at least one power component (184) is thermally connected to the base member (144) on a side opposite to said heat transfer chamber (232).

27. Heat transfer assembly according to one of the preceding embodiments, wherein at least one power component (184) is thermally connected to an area of said base member (144) opposite to a first chamber section (292) of said heat transfer chamber (232).

28. Heat transfer assembly according to one of the preceding embodiments, wherein another power component (188) is thermally connected to an area of said base member (144) opposite to a second chamber section (294) of said heat transfer chamber (232).

29. Heat transfer assembly according to one of the preceding embodiments, wherein said first chamber section (292) of said heat transfer chamber (232) is first hit by said environment induced flow (244) and/or said fan induced flow (264).

30. Heat transfer assembly according to one of the preceding embodiments, wherein said second chamber section (294) of said heat transfer chamber (232) is hit by said environment induced flow (244) and/or said fan induced flow (264) after having passed said first chamber section (292).

31. Heat transfer assembly according to one of the preceding embodiments, wherein said heat transfer assembly (230) comprises a fan receptacle (268) receiving a fan (266).

32. Heat transfer assembly according to one of the preceding embodiments, wherein said heat transfer assembly (230) comprises duct walls (276, 278) extending from said base member (144) forming a flow duct (274) extending from said fan receptacle (268) to said inflow opening (262) of said heat transfer chamber (232) for said fan induced flow (264).

33. Heat transfer assembly according to one of the preceding embodiments, wherein said heat transfer chamber (232) is open on a side opposite to said base member (144).

34. Heat transfer assembly according to one of the preceding embodiments, wherein said flow duct (274) is open on a side opposite to said base member (144).

35. Heat transfer assembly according to one of the preceding embodiments, wherein said heat transfer assembly with said side walls of said heat transfer chamber and said duct walls (276, 278) of said flow duct (274) extends to a common geometric surface (220) arranged opposite to said base member (144).

36. Heat transfer assembly according to one of the preceding embodiments, wherein said heat transfer assembly (230) is adapted to be mounted on a mounting surface with the geometric surface (220) abutting said mounting surface.

37. Heat transfer assembly according to one of the preceding embodiments, wherein said fins (234) extend at maximum to said geometric surface (220).

38. Heat transfer assembly according to one of the preceding embodiments, wherein said flow of cooling medium through said heat transfer chamber (232) comprises a permanent environment induced flow (244) and a need controlled fan induced flow (264).

39. Heat transfer assembly according to one of the preceding embodiments, wherein said fan (266) is controlled by a fan controller (372) detecting the temperature at the at least one power component (184) and activating said fan (266) depending on the temperature detected.

40. A power electronics device (130), in particular a variable frequency drive, comprising a housing (132) and electronic power circuitry (142) with at least one power component (184) arranged in said housing (132), said housing (132) comprising a bottom member (134) provided with a heat transfer assembly (230) for said at least one power component (184, 186, 188) and a cover member (136), said bottom member (134) and said cover member (136) being connected to each other and enclosing a circuitry receptacle (138) receiving said electronic power circuitry (142) with said at least one power component (184).

41. Power electronics device according to embodiment 40 wherein said bottom member (134) and said cover member (136) enclose a junction receptacle (172) with electric junctions (192) arranged therein.

42. Power electronics device according to embodiment 40 or 41, wherein said cover member (136) comprises an access cover (194) removable from said cover member (136) and enabling access to said junction receptacle (172).

43. Power electronics device according to one of embodiments 40 to 42, wherein said access cover (194) is releasably connected to said housing (132) in particular to said bottom member (134).

44. Power electronics device according to one of embodiments 40 to 43, wherein said access cover (194) covers an access opening (196) provided in said cover member (136), said access opening (196) adjoining said junction receptacle (172).

45. Power electronics device according to one of embodiments 40 to 44, wherein said heat transfer assembly (230) is designed according to one of embodiments 1 to 39.

46. Cooling circuit (40) comprising a low pressure section (72) in which a heat absorbing heat exchanger (42) is arranged and a high pressure section (74) in which a heat releasing heat exchanger (62) is arranged and a variable speed compressor unit (54) driven by a power electronics device (130) according to one of embodiments 40 to 45.

47. Method for cooling an electronic power circuitry (142) by a heat transfer assembly (230) comprising a base member (144) and at least one electronic power component (184) in heat conductive contact therewith for transferring heat to said base member (144), providing a heat transfer chamber (232) adjoining said base member (144) and being provided with fins (234) extending from said base member (144) into said heat transfer chamber (232) for transferring heat, providing a flow of cooling medium extending through said heat transfer chamber (232) and passing through spaces between said fins (234) for receiving heat, providing said flow of cooling medium to comprise an environment induced flow (244) extending through said heat transfer chamber (232) and entering said heat transfer chamber (232) with respect to the direction of gravity (250) in a lower section (242) thereof and exiting from said heat transfer chamber (232) with respect to said direction of gravity (250) from an upper section (246, 248) thereof, and providing said flow of cooling medium with a fan induced flow (264) extending through said heat transfer chamber (232) and entering said heat transfer chamber (232) in a section (262) different from said section (242) of entering of said environment induced flow (244) if necessary.

48. Method according to embodiment 47, wherein said flow of cooling medium through said heat transfer chamber (232) is provided with a permanent environment induced flow (244) and a need controlled fan induced flow (264).

49. Method according to embodiment 47 or 48, wherein a fan (266) providing said fan induced flow (264) is controlled by a fan controller (372) detecting the temperature at the at least one power component (184) and activating said fan (266) depending on the temperature detected.

Further feature and advantages of the inventive concepts are subject matter of the subsequent description and the drawings.

DETAILED DESCRIPTION OF THE INVENTION

Figure 1:
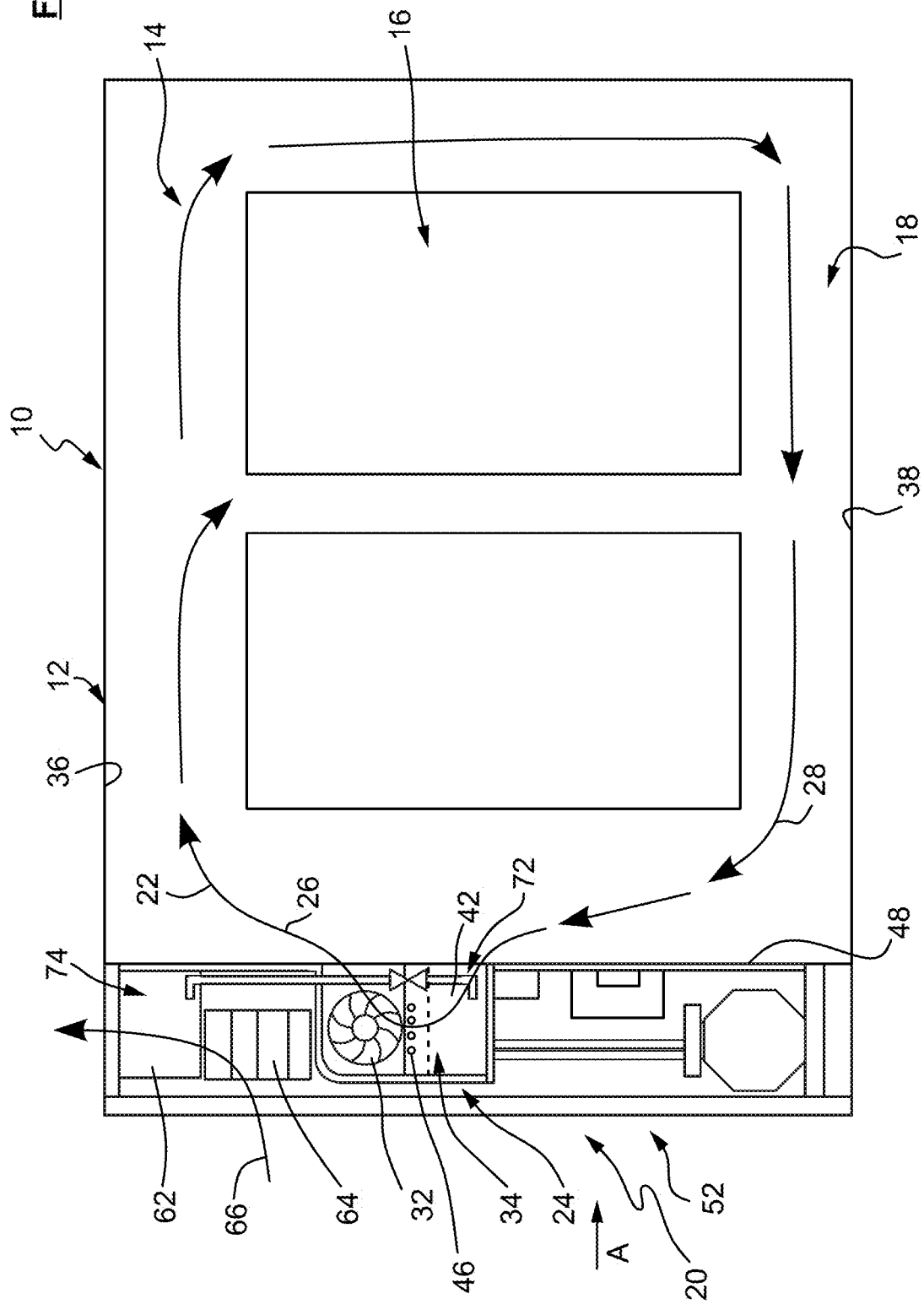
FIG. 1 shows a longitudinal sectional view through a storage unit storing cargo at a defined temperature, in particular a storage unit provided with a tempering system, in particular a refrigeration system.

The invention is explained for example in connection with a storage unit 10 comprising an insulated housing 12 enclosing a storage volume 14 within which temperature sensitive cargo 16 is received surrounded by a gaseous medium 18, in particular air, which is kept at a defined temperature level for maintaining said cargo 16 in a defined temperature range.

However the inventive concept can be used in any other environment.

Said storage unit 10 can be for example a storage unit 10 in a supermarket or any other warehouse.

Said storage unit 10 can also be a transportable storage unit, for example of a truck or a trailer or a ship or a railway carriage transporting cargo 16 or a conventional container for shipping cargo 16 by truck, railway or ship.

In order to maintain a defined or set temperature range of cargo 16 a flow 22 of said gaseous medium 18 is circulating through volume 14 starting from a tempering unit 24 as a supply gas flow 26 and entering tempering unit 24 as a return gas flow 28.

The circulating gas flow 22 is for example generated by a fan unit 32 preferably arranged within tempering unit 24 and tempered by a heat exchange unit 34 arranged within tempering unit 24.

Preferably supply gas flow 26 exits from tempering unit 24 in an area close to an upper wall 36 of insulated housing 12 and preferably returns to tempering unit 24 close to a lower wall 38 of insulated housing 12 forming said return gas flow 28.

Figure 2:
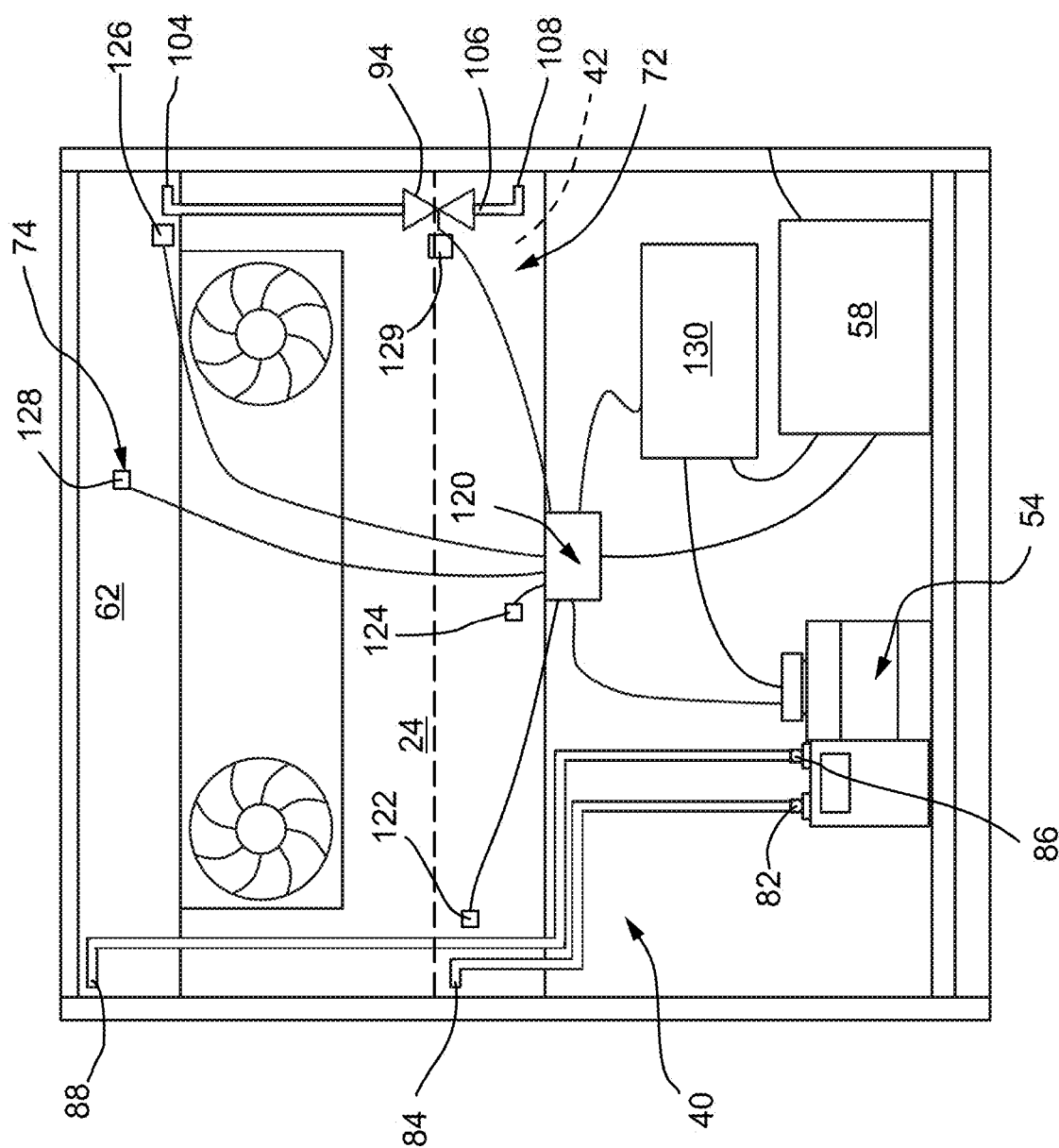
FIG. 2 represents a front view on the storage unit in direction of arrow A in FIG. 1.

According to a preferred embodiment heat exchange unit 34 comprises a heat absorbing heat exchanger 42 arranged in a refrigerant circuit 40 as shown in FIG. 2 and in particular further comprises heaters 46 which are for example electric heaters.

Tempering unit 24 is for example arranged between lower wall 38 and upper wall 36 of isolated housing 12, in particular on a front wall 48 or a rear wall thereof.

However, tempering unit 24 can also be arranged on upper wall 36 or a lower wall 38.

Tempering unit 24 is associated with peripheric unit 52 which comprises a heat releasing heat exchanger 62 and a fan unit 64 for generating a flow of ambient air 66 through heat releasing heat exchanger 62.

In case of a transportable storage unit 10 a compressor unit 54 and a power source 58 are provided and for example integrated in peripheric unit 52.

In case of a stationary unit 10 compressor unit 54 is arranged separate and power is supplied by a mains power network.

Cooling circuit 40, as shown in FIG. 2, comprises a low pressure section 72, in which heat absorbing heat exchanger 42 is arranged and a high pressure section 74, in which a heat releasing heat exchanger 62 is arranged, and compressor unit 54 connected with a suction connection 82 to an outlet 84 of heat absorbing heat exchanger 42 and with a discharge connection 86 to an inlet 88 of heat releasing heat exchanger 62, so that compressor unit 54 can generate a compression flow 90 of refrigerant from low pressure section 72 to high pressure section 74.

Further cooling circuit 40 as shown in FIG. 2 comprises an expansion device 94 being connected directly or indirectly to an outlet 104 of heat releasing heat exchanger 62 for example via a receiver for liquid refrigerant (not shown in FIG. 2) and an expansion device 94 being connected with its outlet 106 to an inlet 108 of heat absorbing heat exchanger 42.

A control unit 120 associated with cooling circuit 40 is for example connected to a pressure sensor 122 associated with low pressure section 72 and/or a temperature sensor 124 associated with low pressure section 72 and also connected to a pressure sensor 126 associated with high pressure section 74 and/or a temperature sensor 128 associated with high pressure section 74.

Further control unit 120 is for example connected to a variable frequency drive 130 of compressor unit 54 and to an adjusting means 129 for adjusting expansion device 94.

In particular adjusting means 129 is a drive for adjusting expansion device 94 which is for example an expansion valve.

Said cooling circuit 40 is in particular operated by said control unit 120 in a heat transfer mode in which said compressor unit 54 is speed controlled by means of variable frequency drive 130 for driving compressor unit 54 and said expansion device 94 is controlled in accordance with the amount of heat to be transferred from said heat absorbing heat exchanger 42 to said heat releasing heat exchanger 62 depending on the temperature of the flow of ambient air 66, according conventional control procedures.

Figure 3:
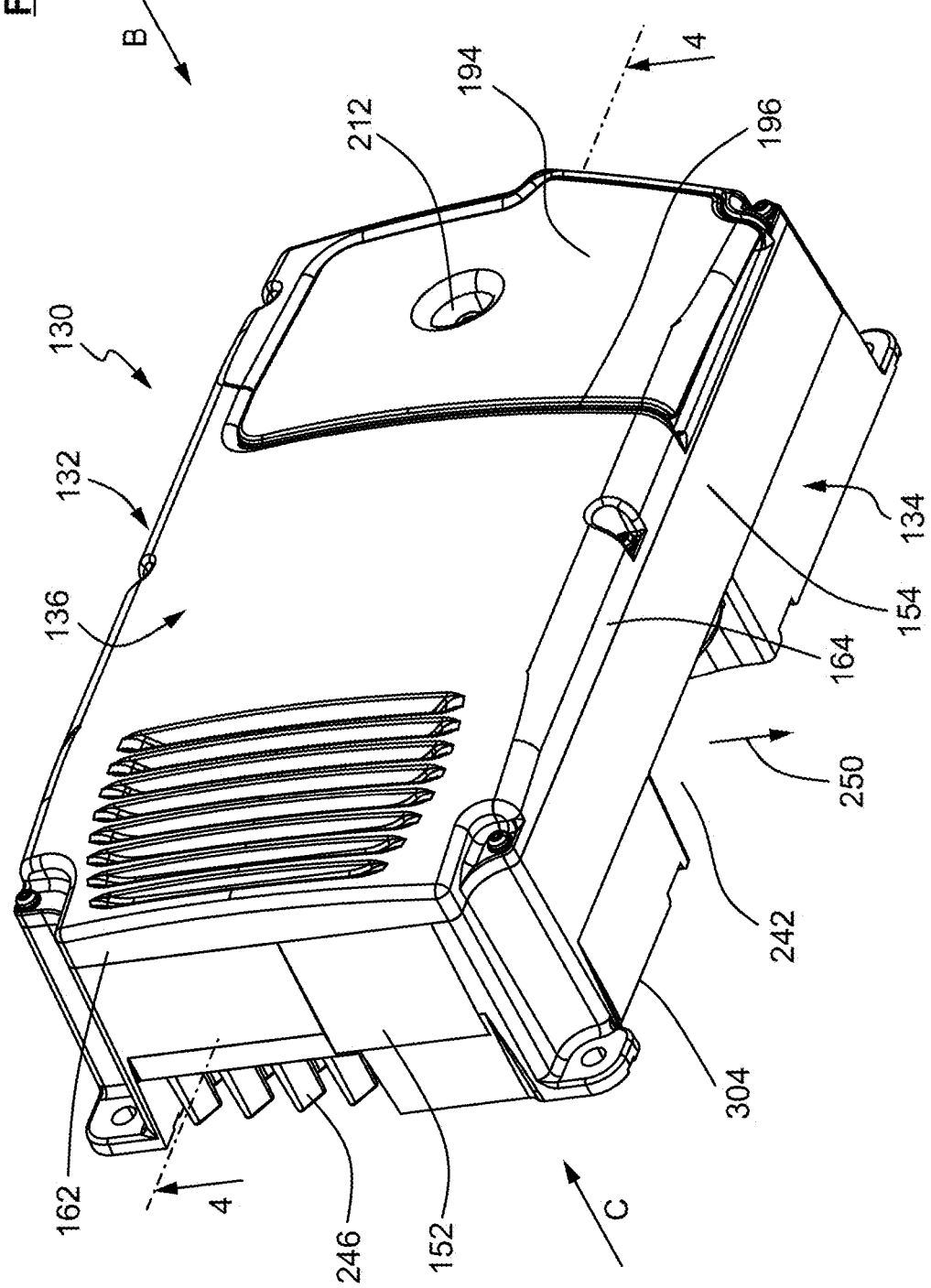
FIG. 3 is a perspective view of a power electronics device, in particular a variable frequency drive for a compressor for use in a storage unit according to FIGS. 1 and 2.
Figure 4:
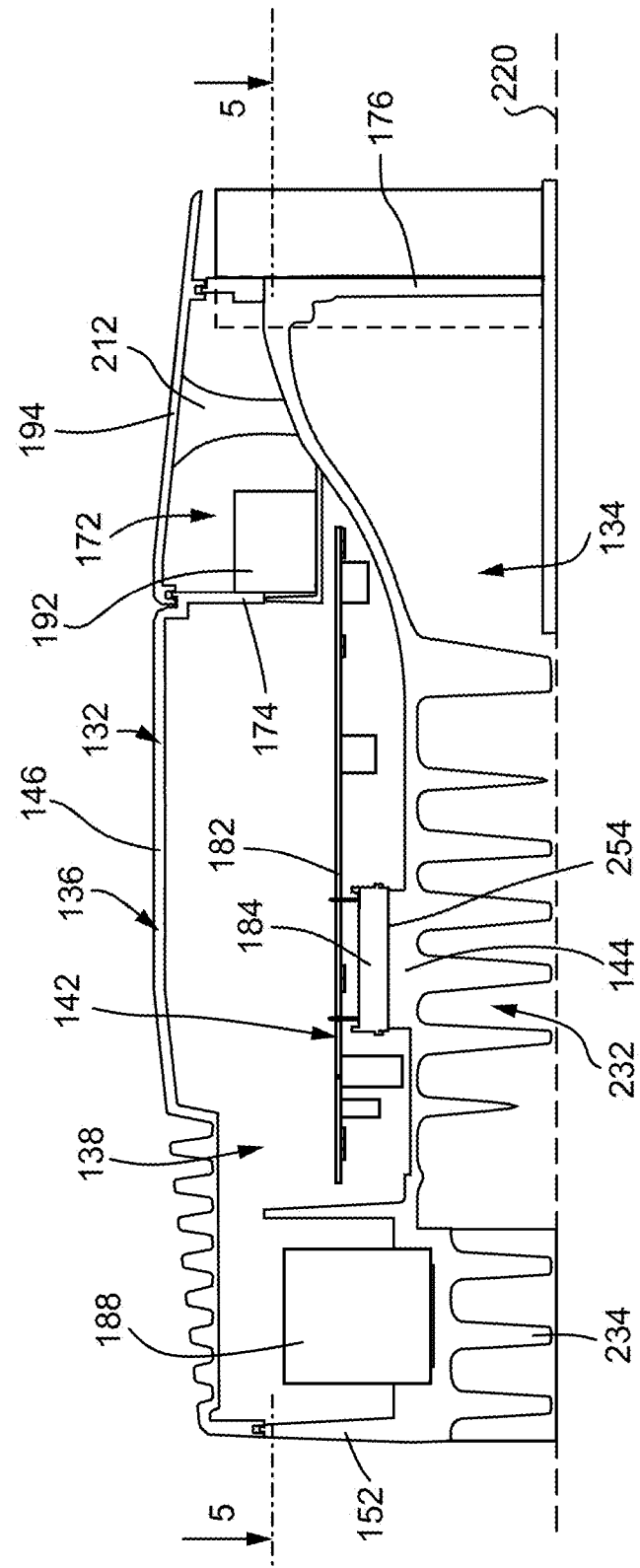
FIG. 4 is a sectional view along line 4-4 in FIG. 3.

The variable frequency drive 130 comprises a housing 132 which housing 132 itself comprises a bottom member 134 and a cover member 136 (FIG. 3) which (as shown in FIG. 4) encloses a circuitry receptacle 138 in which electronic power circuitry 142 is arranged.

Figure 5:
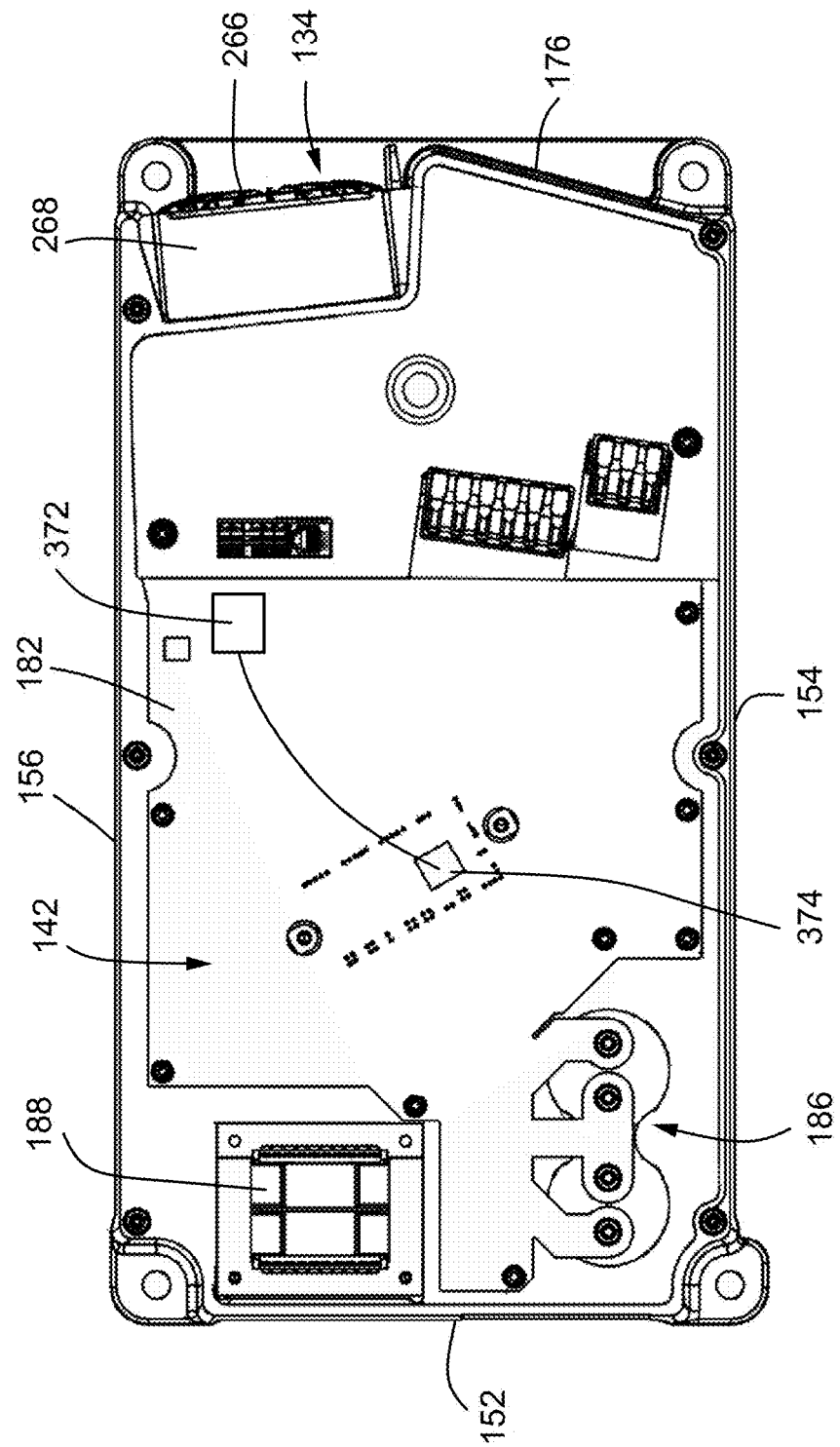
FIG. 5 is a sectional view along line 5-5 in FIG. 4.

In particular said circuitry receptacle 138 is arranged between a base member 144 of said bottom member 134 and an upper wall 146 of said cover member 136 and said circuitry receptacle 138 is further limited by outer side walls 152, 154, 156 and 176 of said bottom member 134 which extend from base member 144 up to cover member 136 in particular up to outer rim portions 162, 164 and 166 of cover member 136 (FIGS. 3 to 5).

Further, circuitry receptacle 138 is separated from a junction receptacle 172 by a separating wall 174 and junction receptacle 172 is for example enclosed by base member 144, by separating wall 174 extending between base member 144 and by upper wall 146 of cover member 136 and further junction receptacle 172 is enclosed by portions of side walls 154 and 156 as well as an end wall 176 of base member 144 arranged opposite to separating wall 174.

Electronic power circuitry 142 comprises a circuit board 182 with power components, such as for example at least one semiconductor power component 184, in particular comprising at least one IGBT chip, at least one, in particular two, capacitors 186 and at least one DC inductor 188 (FIGS. 4, 5).

All power components 184, 186, 188 generate heat, for example in operation power component 184 generates the highest amount of heat, power component 188 generates a lower amount of heat and power component 186 generates the lowest amount of heat.

In junction receptacle 172 electric junctions 192, in particular junction bars, are arranged which enable connection of the electronic power circuitry 182 to power source 58 and compressor 54 as well as control unit 120.

In order to enable easy access to junction receptacle 172 for installation, set-up and/or maintenance work cover member 136 is provided with an access cover 194 which is releasably insertable into access opening 196 provided in cover member 136 and arranged above junction receptacle 172 so that removing of access cover 194 enables easy access to junction receptacle 172 from the side of cover member 136 which still covers circuitry receptacle 138 and fully protects said circuitry receptacle 138 if the various electric lines are connected to electric junctions 182.

In particular access opening 196 and access cover 194 can be fluid tight connected by a sealing arrangement having two cooperating sealing member one sealing member 202 being arranged on access cover 194 and the other sealing member 204 being arranged on access opening 196 in order to provide the fluid tight seal between them.

Figure 6:
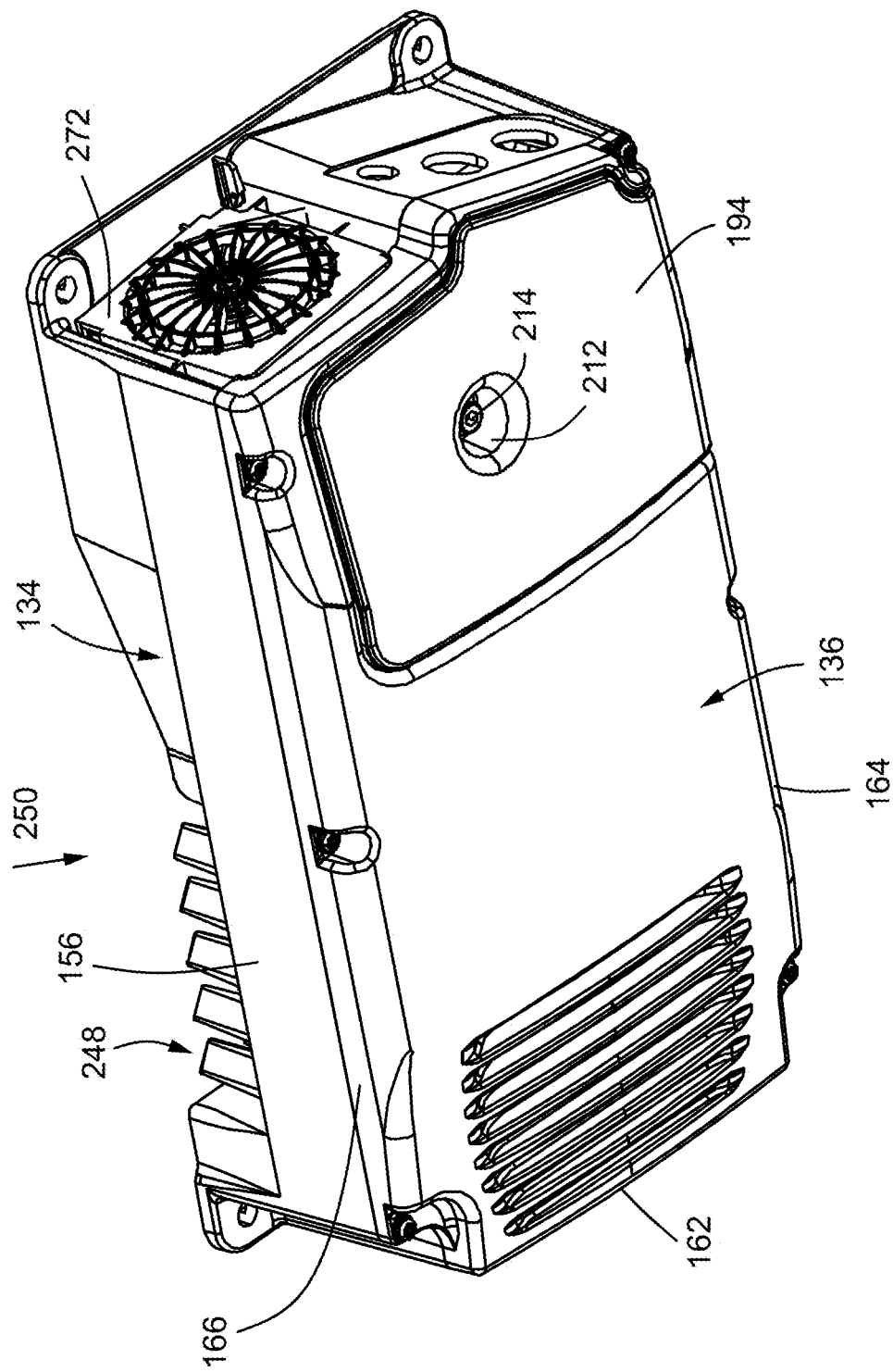
FIG. 6 is a perspective view in direction of arrow B in FIG. 3.
Figure 7:
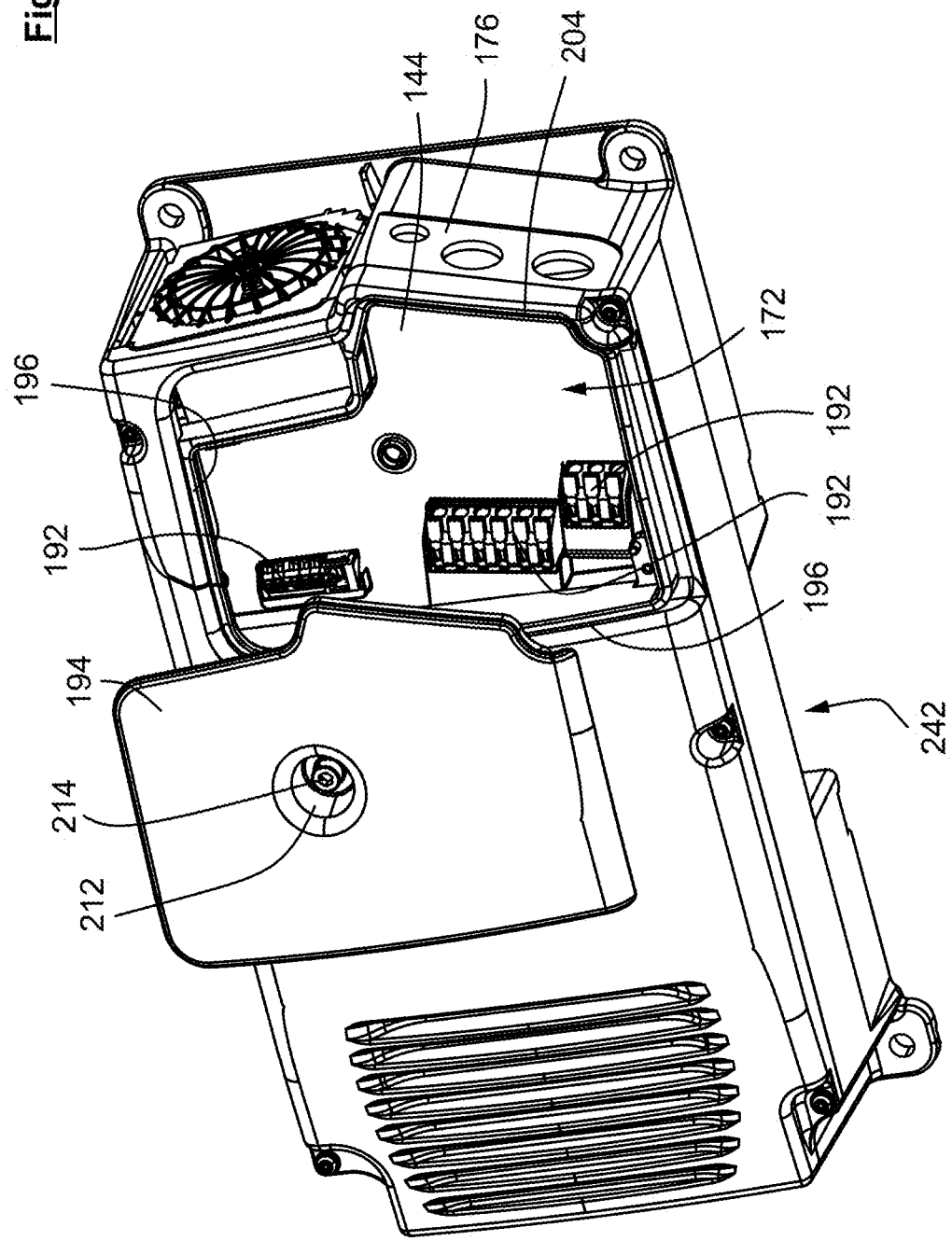
FIG. 7 is a perspective view similar to FIG. 1 with an access cover removed from a cover member of said housing.
Figure 8:
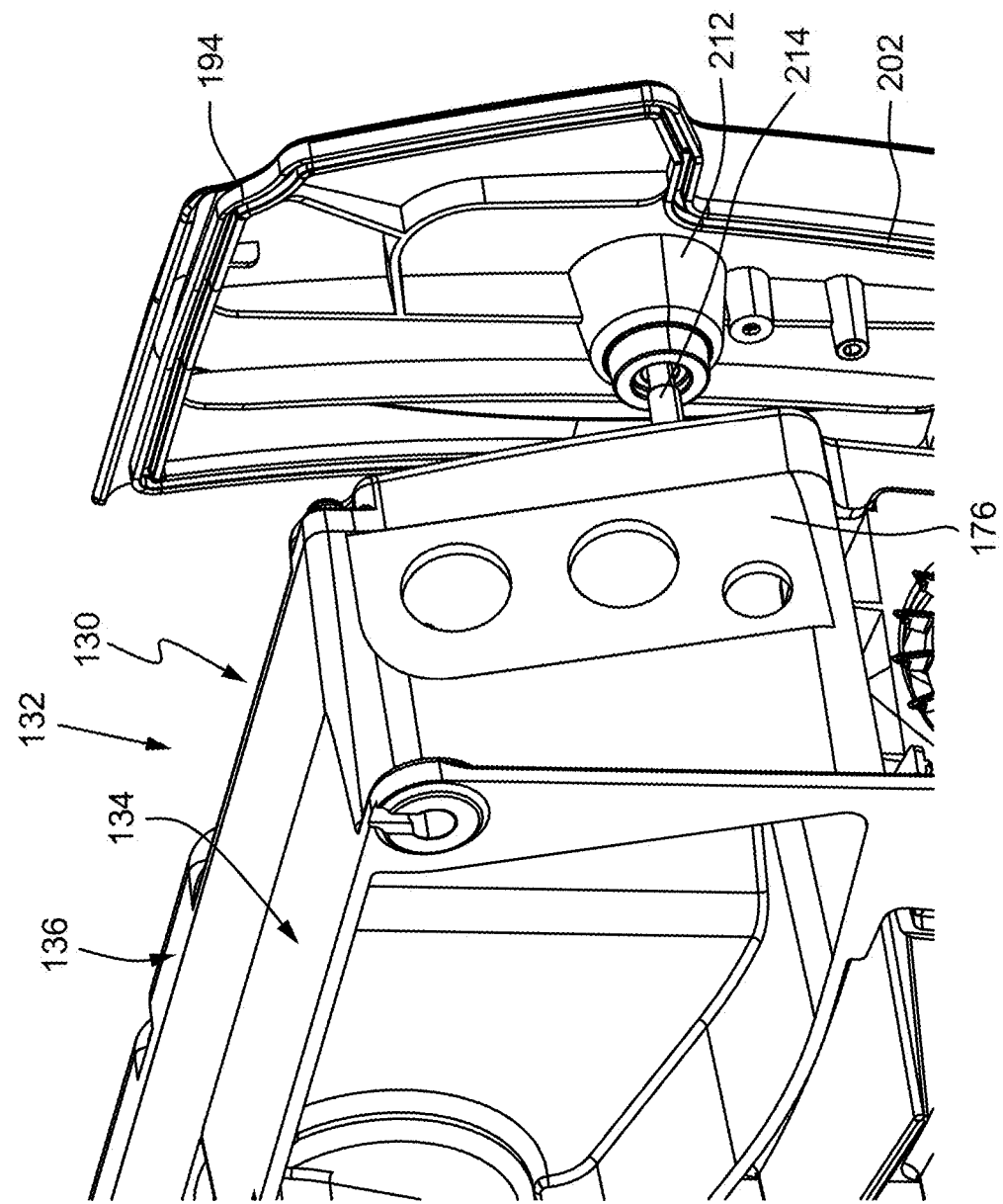
FIG. 8 is an enlarged view on part of the housing with the access cover removed.

For example for easy removal access cover 194 is provided with a depression 212 extending downward from access cover 194 towards base member 144 of bottom member 134 such that access cover 194 can be fixed to base member 144 of bottom member 134 by a screw 214 connecting depression 212 to base member 144 (FIGS. 6 to 8). In particular a single screw 214 is provided and arranged such that its closing force applies to every site of sealing members 202 and 204 essentially to the same amount.

Base member 144 of bottom member 134 extends above a mounting surface 220 of housing 132 on which bottom member 134 is supported (FIG. 4).

Figure 9:
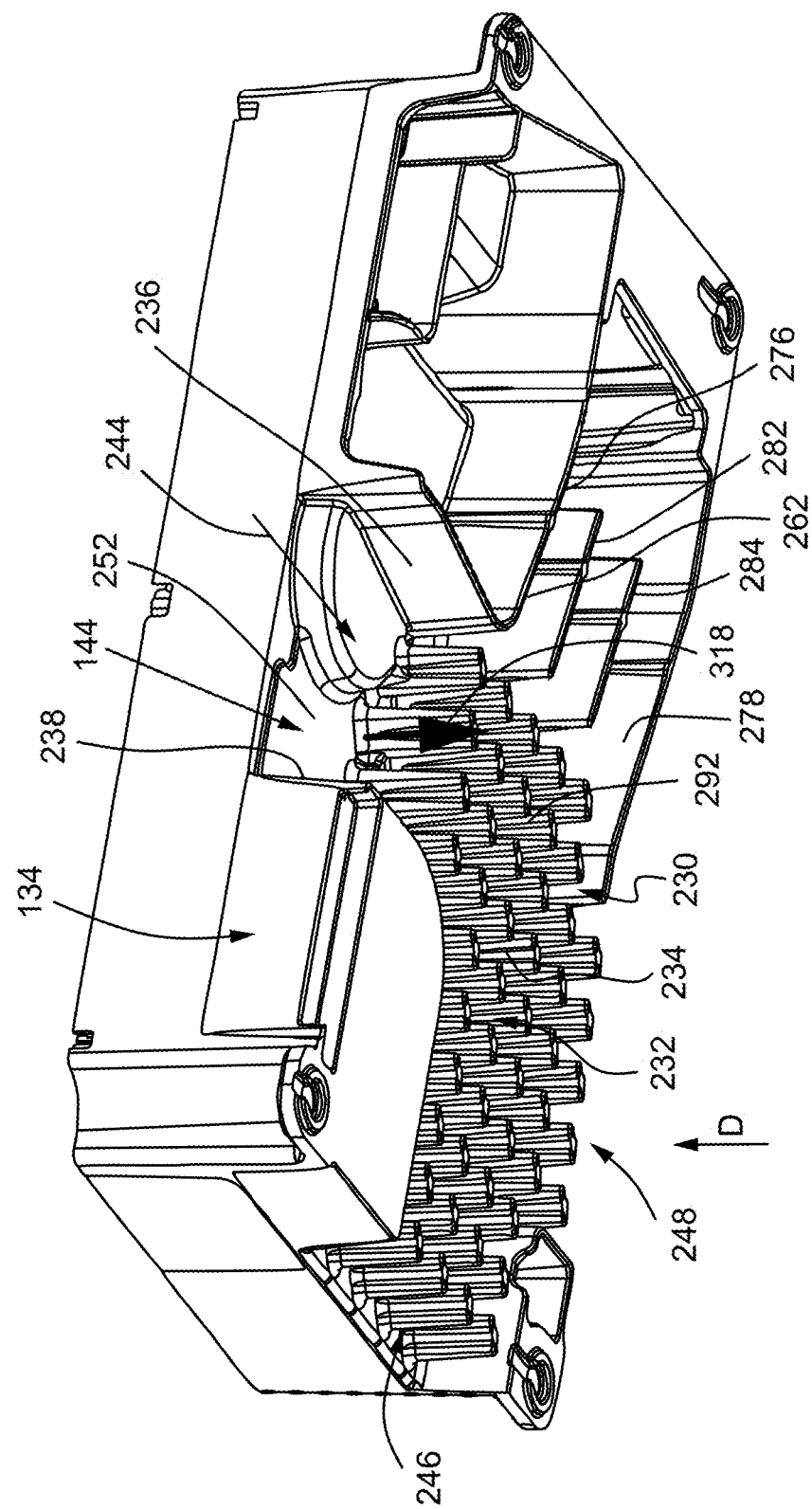
FIG. 9 is a perspective view in direction of arrow C in FIG. 3.

This enables arrangement of a heat transfer chamber 232 between base member 144 of bottom member 134 and mounting surface 220 as for example shown in FIGS. 4 and 9.

Base member 144 and heat transfer chamber 232 are part of a heat transfer assembly 230 which in addition to base member 144 with power components 184 and 186 and 188 connected thereto comprises a plurality of fins or ribs 234 extending from base member 144 towards mounting surface 220 and side walls 236 and 238 of said heat transfer chamber 232 extending from said base member 144 towards mounting surface 220 in order to guide a flow of cooling media through said heat transfer chamber 232 and to and around said fins 234 (FIGS. 7 and 9 to 12).

In particular, said heat transfer assembly 230 comprises a first inflow opening 242 through which an environment induced flow 244 enters said heat transfer assembly 230, extends through said heat transfer chamber 232 and leaves said heat transfer chamber 232 through outflow openings 246 and 248. The environment induced flow 244 extends with the component opposite to the direction of gravity 250 after entering said first inflow opening 242 (FIGS. 7 and 9 to 12) and on its way to outflow openings 246 and 248 (FIGS. 3, 6 and 9 to 12) hits and extends around fins 234 and also flows along a surface 252 of base member 144 limiting heat transfer chamber 232 on its side opposite to said mounting surface 220.

Outflow openings 246 and 248 are arranged with respect to the direction of gravity 250 higher than first inflow opening 242 so that environment induced flow 244 when being heated in said heat transfer chamber 232 flows upwards with respect to the direction of gravity 250 and either leaves heat transfer chamber 232 through outflow opening 246 arranged between first inflow opening 242 and outflow opening 248 or outflow opening 248 which is arranged higher than outflow opening 246 and first inflow opening 242.

Heat transfer assembly 230 enables an effective heat transfer to environment induced flow 244 of heat transfer to base member 144 from power component 184 which preferably is connected to base member 144 by a heat transfer medium providing an optimized heat transfer from power component 184 to base member 144.

Figure 10:
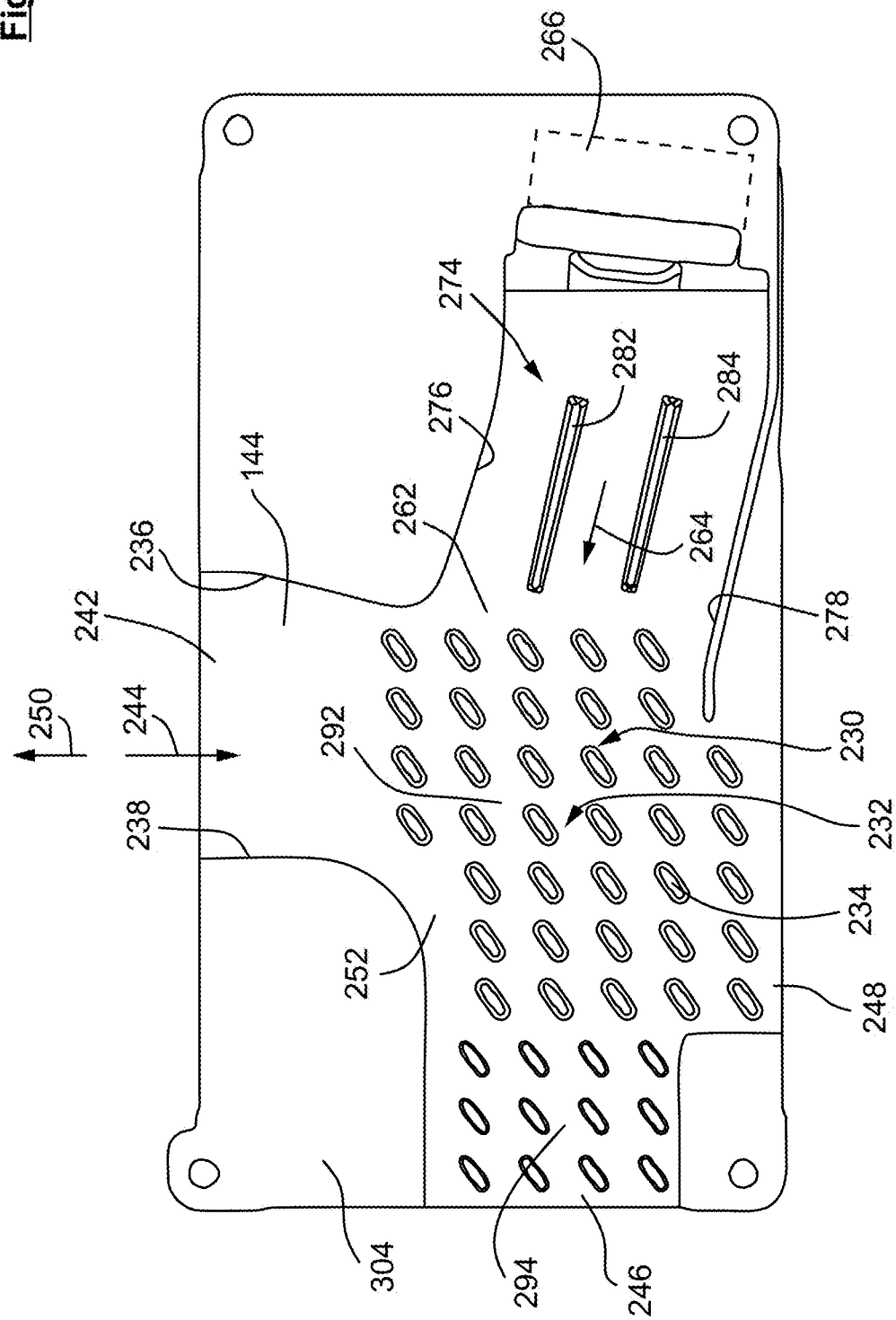
FIG. 10 is a bottom view in direction of arrow D in FIG. 9.

In addition to environment induced flow 244 a fan induced flow 264 can be generated which enters heat transfer chamber 232 through second inflow opening 262 which is arranged separate from first inflow opening 242 and can be arranged with respect to the direction of gravity 250 for example at a level similar to the first inflow opening but also at a level which is arranged with respect to the direction of gravity 250 higher than first inflow opening 242 as for example shown in FIG. 10.

Fan induced flow 264 after having entered second inflow opening 262 of heat transfer chamber 232 extends through heat transfer chamber 232 and leaves heat transfer chamber 232 through outflow openings 246 and/or 248 so that in heat transfer assembly 230 heat will be also transferred to fan induced flow 264 by contact with fins 234 and surface 252 of base member 144.

Fan induced flow 264 is for example generated by a fan 266 received in a receptacle 268 provided within said housing 132, in particular between an outer wall 272 (FIG. 6) of cover member 136 and end wall 176 of bottom member 134 extending between sidewalls 154 and 156 of bottom member 134 said fan 266 blowing air from outside housing 132 into a flow duct 274 extending between fan receptacle 268 and second inflow opening 262, said flow duct 274 being limited by walls 276 and 278 extending from base member 144 of bottom member 134 to mounting surface 220.

Figure 11:
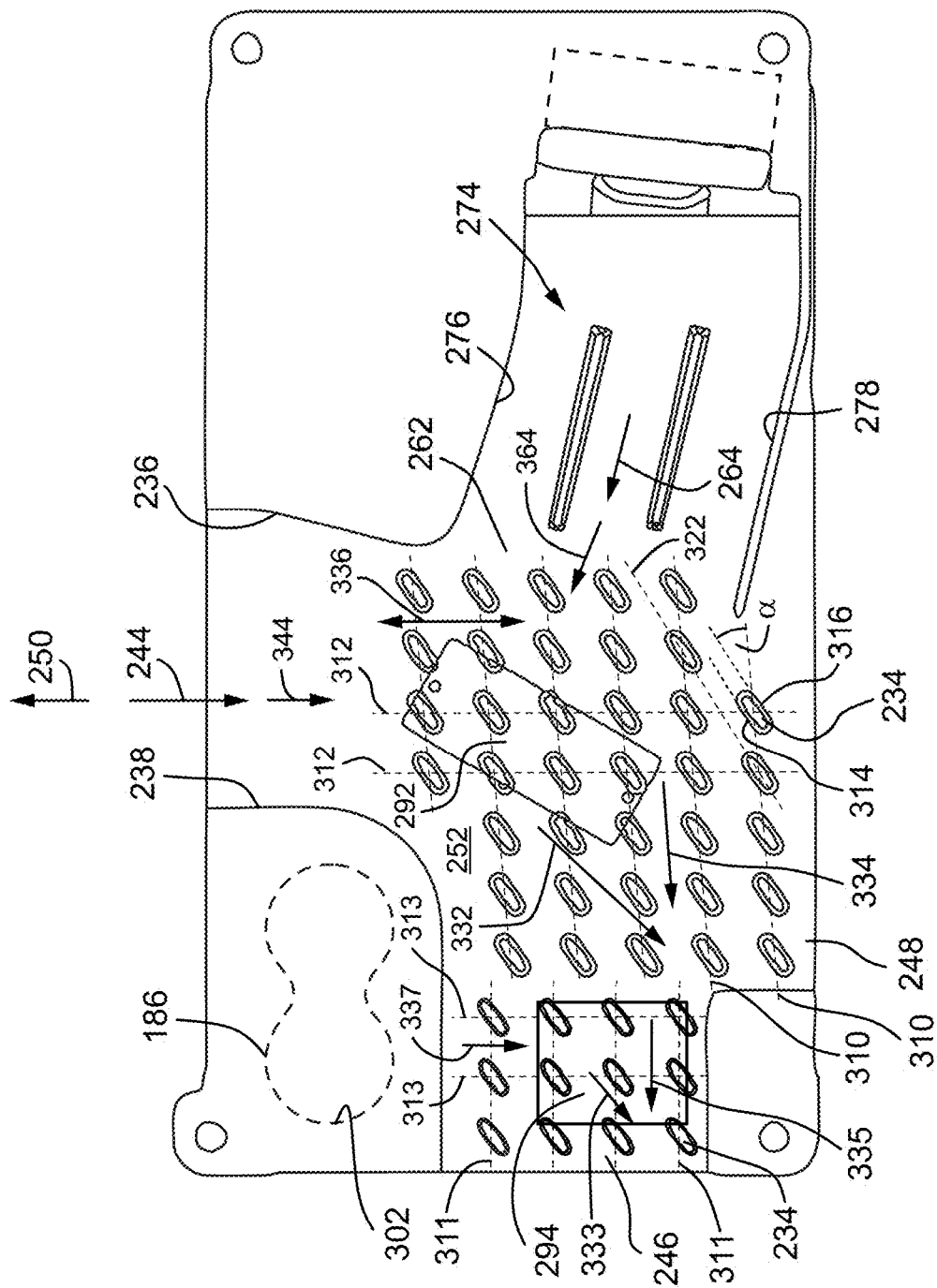
FIG. 11 is a bottom view similar to FIG. 10 with the position of the heat generating power components indicated.

Preferably, for providing proper direction to fan induced flow 264 flow duct 274 is provided with inner ribs 282 and 284 extending towards second inflow opening 262 and providing proper guidance to fan induced flow 264 on its way to second inflow opening 262 (FIGS. 10, 11).

Environment induced flow 244 and fan induced flow 264 when entering heat transfer chamber 232 are first entering a first chamber section 292 of heat transfer chamber 232 (FIGS. 9 to 11) which is the section of heat transfer chamber 232 being arranged directly opposite to power component 184 generating most of the heat of electronic power circuitry 142 and being directly arranged on and thermally coupled to base member 144 opposite to first chamber section 292 so that said first chamber section 292 represents the hottest chamber section of heat transfer chamber 232.

For this reason first chamber section 292 is the chamber section being arranged closest to first inflow opening 242 and second inflow opening 262.

After having passed through first chamber section 292 environment induced flow 244 as well as fan induced flow 264 can reach a second chamber section 294 being arranged between first chamber section 292 and outflow opening 246 whereas first chamber section 292 extends until outflow opening 248.

For example second chamber section 294 receives heat from power component 188 which generates a lower amount of heat than power component 184 and is thermally coupled to base member 144 in the area just opposite to second chamber section 294 by a heat transfer medium.

Capacitors 186 also representing power components create only a small amount of heat so that capacitors 186 can be arranged in a capacitor receptacle 302 extending from a bottom wall 304 of bottom member 134 and being arranged between base member 144 and mounting surface 220, for example essentially abutting on mounting surface 220 said capacitor receptacle 302 being separated from heat transfer chamber 232 by side wall 238 extending from first inflow opening 242 to outflow opening 246.

Therefore capacitor receptacle 302 is essentially cooled by heat transfer through side wall 238 which is able to transfer heat to environment induced flow 244 and fan induced flow 264.

In particular in first chamber section 292 fins 234 are arranged in first rows 310 and second rows 312 extending parallel to each other which rows 310 and 312 have a certain distance from each other and therefore define transverse channels 334 and 336 therebetween.

In addition, the fins 234 have opposite longitudinal sides 314 and 316 also extending parallel to each other said longitudinal sides 314, 316 extending at an angle of c of inclination to said rows 310 and 312.

Further fins 234 extend from base member 144 in a direction of height 318 away from base member 144 (FIG. 9) which essentially corresponds to the distance between base member 144 and mounting surface 220 (FIG. 4).

The longitudinal sides 314 and 316 extend transverse to the extension of height 318 and essentially parallel to surface 252 of base member 144 over a distance which amounts to at least three times the thickness of fins 234 represented by the distance between longitudinal sides 314 and 316.

Further, the extension of the longitudinal sides 314 and 316 of fins 234 is in the range from half the extension of fins 234 in the height direction 318 to a quarter of the extension of fins 234 in the height direction 318.

Further, all fins 234 with their longitudinal sides 314 and 316 extend parallel to a direction 322 which extends at the angle α to the rows 310 and 312.

Consequently, all fins 234 in the first chamber section 292 are spaced with respect to each other in direction of rows 310 and 312 the spacing between the fins 234 being in the range from twice the thickness of the fins 234 corresponding the distance between their longitudinal sides 314 and 316 to four times the thickness of the fins 234.

Further, the distance between the respective parallel rows 310 and 312 is in the range from the extension of longitudinal sides 314 and 316 transverse to the direction of height 318 to three times the extension of the longitudinal sides 314, 316 of fins 234 transverse to their direction of height 318.

With this arrangement of fins 234 in first chamber section 292 longitudinal the environment induced flow 244 as well as fan induced flow 264 are guided along channels 332 extending essentially parallel to said longitudinal sides 314 and 316 of said fins 234 and transverse channels 334 and 336 extending parallel to said rows 310 and 312.

In particular environment induced flow 344 enters first chamber section with a first inflow direction 344 extending transverse to rows 310 and at an angle of inclination to longitudinal sides 314, 316 of fins 134 so that the environment induced flow 244 is redirected by fins 234 in said first chamber section 292 in direction of longitudinal channels 332 as well as a direction of first transverse channels 334 so that all fins 234 are hit by environment induced flow 244 in order to obtain an optimized heat transfer. Further second transfer channels 336 serve to further distribute environment induced flow 344 transverse to first transverse channels 334.

Further, fan induced flow 264 enters heat transfer chamber 232, in particular first chamber section 292 thereof in a second inflow direction 364 extending transverse to said longitudinal sides 314 and 316 of said fins 234 and also transverse to said rows 310 and 312 so that fan induced flow 264 is redirected along longitudinal channels 332 and first chamber section 292 by second transverse channels 336 and further by first transverse channels 334.

Further, in second chamber section 294 fins 234 can be arranged along the same rows 310 and 312 as in first chamber section 292 however as for example shown in FIG. 11 fins 234 in second chamber section 294 are arranged in rows 311 and 313 all extending parallel to each other but being arranged different from rows 310 and 312 and form longitudinal channels 333 as well as transverse channels 335 and 337 being different from channels 334 and 336, which arrangement of channels 335 and 337 enables optimization of further heat transfer in second chamber section 294.

In order to save energy electronic circuit board 182 is provided with a fan controller 372 which controls operation of fan 368 and which is connected to a temperature sensor 374 arranged next to or in power component 184 of circuit board 182 so that fan 268 is only operated in case power component 184 exceeds a certain temperature level (FIG. 5).

Usually environment induced flow 244 is efficient for the transfer of heat generated by power components 184, 186 and 188 when operating compressor 54 in the part load mode and only in case compressor 54 is operated in the full load mode heat generated by power components 184 and 188 leads to an increase of temperature in power component 184 which is detected by sensor 374 and therefore leads to switching on a fan 268 by fan controller 372.

In addition the orientation of all wall surfaces, in particular wall surfaces 236 and 238, of heat transfer chamber 232 as well as the orientation of fins 234 is chosen such that they are all inclined with respect to the direction of gravity 250 to guide water or particles towards the first inflow opening 242 in order to leave heat transfer chamber 232 in direction of gravity through inflow opening 242 so that no pockets for collection of water and/or dirt in heat transfer chamber 232 of heat transfer assembly 230 are formed (FIG. 10, 11).

In particular, this design enables use of said heat transfer assembly under rough (outdoor) conditions, due to its ability to operate properly, for example by rain and/or sea water and/or fog.

The invention claimed is:

1. A heat transfer assembly for cooling an electronic power circuitry, said heat transfer assembly comprising:
   a base member and at least one electronic power component in heat conductive contact for transferring heat to said base member;
   a heat transfer chamber adjoining said base member and being provided with fins extending from said base member into said heat transfer chamber for transferring heat to a flow of cooling medium, extending through said heat transfer chamber and passing through spaces between said fins;
   wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
   wherein said heat transfer assembly is designed such that said flow of cooling medium can be supplemented by a fan induced flow extending through said heat transfer chamber and entering said heat transfer chamber in a location different from the location of entry of said environment induced flow; and
   wherein said fins are arranged in said heat transfer chamber to define transverse flow channels extending transverse to the longitudinal flow channels.

2. Heat transfer assembly according to claim 1, wherein said environment induced flow in said heat transfer chamber has a flow component opposite to the direction of gravity.

3. Heat transfer assembly according to claim 1, wherein said environment induced flow is guided by said fins in a direction deviating from the direction of gravity.

4. Heat transfer assembly according to claim 1, wherein said environment induced flow extends along a longitudinal side of said fins.

5. Heat transfer assembly according to claim 1, wherein said fins extend from said base member in a height direction and extend with their longitudinal sides have an extension in a direction transverse to said height direction which is greater than a thickness of said fins.

6. Heat transfer assembly according to claim 1, wherein said fins are arranged at distance with respect to each other transverse to said longitudinal sides thereof for forming longitudinal flow channels extending parallel to said longitudinal sides of said fins.

7. Heat transfer assembly according to claim 1, wherein said fins in directions parallel to their longitudinal sides are arranged at distances with respect to each other.

8. A heat transfer assembly for cooling an electronic power circuitry, said heat transfer assembly comprising:
   a base member and at least one electronic power component in heat conductive contact for transferring heat to said base member;
   a heat transfer chamber adjoining said base member and being provided with fins extending from said base member into said heat transfer chamber for transferring heat to a flow of cooling medium, extending through said heat transfer chamber and passing through spaces between said fins;
   wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
   wherein said heat transfer assembly is designed such that said flow of cooling medium can be supplemented by a fan induced flow extending through said heat transfer chamber and entering said heat transfer chamber in a location different from the location of entry of said environment induced flow;
   wherein said fins are aligned in first rows extending essentially parallel to each other; and
   wherein said fins are aligned in second rows extending essentially parallel to each other and transverse to said first rows.

9. Heat transfer assembly according to claim 8, wherein said first and second rows define first and second transverse channels between said fins.

10. Heat transfer assembly according to claim 9, wherein said first and second transverse channels distribute the flow between longitudinal channels.

11. Heat transfer assembly according to claim 8, wherein said fins with their longitudinal sides extend transverse to said first and second rows.

12. Heat transfer assembly according to claim 1, wherein an extension of the longitudinal sides said fins corresponds to values in a range starting thickness to five times the thickness of said fins.

13. A heat transfer assembly for cooling an electronic power circuitry, said heat transfer assembly comprising:
   a base member and at least one electronic power component in heat conductive contact for transferring heat to said base member;
   a heat transfer chamber adjoining said base member and being provided with fins extending from said base member into said heat transfer chamber for transferring heat to a flow of cooling medium, extending through said heat transfer chamber and passing through spaces between said fins;
   wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
   wherein said heat transfer assembly is designed such that said flow of cooling medium can be supplemented by a fan induced flow extending through said heat transfer chamber and entering said heat transfer chamber in a location different from the location of entry of said environment induced flow; and
   wherein said environment induced flow enters said heat transfer chamber in a first inflow direction extending at an acute angle to said longitudinal sides of said fins.

14. Heat transfer assembly according to claim 13, wherein said fan introduced flow enters said heat transfer chamber in a second inflow direction extending at an acute angle to said longitudinal sides of said fins which is in particular different from said angle of said first inflow direction.

15. Heat transfer assembly according to claim 14, wherein the first inflow direction and the second inflow direction extend transverse to each other.

16. Heat transfer assembly according to claim 15, wherein said longitudinal sides of said fins extend between said first inflow direction and said second inflow direction.

17. A heat transfer assembly for cooling an electronic power circuitry, said heat transfer assembly comprising:
a base member and at least one electronic power component in heat conductive contact for transferring heat to said base member;
a heat transfer chamber adjoining said base member and being provided with fins extending from said base member into said heat transfer chamber for transferring heat to a flow of cooling medium, extending through said heat transfer chamber and passing through spaces between said fins;
wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
wherein said heat transfer assembly is designed such that said flow of cooling medium can be supplemented by a fan induced flow extending through said heat transfer chamber and entering said heat transfer chamber in a location different from the location of entry of said environment induced flow; and
wherein said fins are oriented so as to direct said environment induced flow in longitudinal channels and transverse channels.

18. Heat transfer assembly according to claim 17, wherein said fins are oriented so as to guide said fan induced inflow into said longitudinal channel and said transverse channels.

19. Heat transfer assembly according to claim 1, wherein a majority of fins has essentially the same orientation of their longitudinal sides.

20. Heat transfer assembly according to claim 1, wherein said longitudinal sides of said fins deviate from a parallel orientation by angles in the range from 0 degrees to 20 degrees.

21. Heat transfer assembly according to claim 1, wherein said heat transfer assembly comprises side walls limiting said heat transfer chamber and extending from said base member.

22. Heat transfer assembly according to claim 1, wherein said sidewalls form a first inflow opening of said heat transfer chamber for said gravity included flow.

23. Heat transfer assembly according to claim 22, wherein said heat transfer assembly comprises sidewalls forming a second inflow opening of said heat transfer chamber for said fan included flow.

24. A heat transfer assembly for cooling an electronic power circuitry, said heat transfer assembly comprising:
a base member and at least one electronic power component in heat conductive contact for transferring heat to said base member;
a heat transfer chamber adjoining said base member and being provided with fins extending from said base member into said heat transfer chamber for transferring heat to a flow of cooling medium, extending through said heat transfer chamber and passing through spaces between said fins;
wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
wherein said heat transfer assembly is designed such that said flow of cooling medium can be supplemented by a fan induced flow extending through said heat transfer chamber and entering said heat transfer chamber in a location different from the location of entry of said environment induced flow; and
wherein said at least one power component is thermally connected to the base member on a side opposite to said heat transfer chamber.

25. Heat transfer assembly according to claim 1, wherein at least one power component is thermally connected to an area of said base member opposite to a first chamber section of said heat transfer chamber.

26. Heat transfer assembly according to claim 1, wherein another power component is thermally connected to an area of said base member opposite to a second chamber section of said heat transfer chamber.

27. Heat transfer assembly according to claim 1, wherein said first chamber section of said heat transfer chamber is first hit by said environment induced flow and/or said fan induced flow.

28. Heat transfer assembly according to claim 1, wherein said second chamber section of said heat transfer chamber is hit by said environment induced flow and/or said fan induced flow after having passed said first chamber section.

29. Heat transfer assembly according to claim 1, wherein said heat transfer assembly comprises a fan receptacle receiving a fan.

30. Heat transfer assembly according to claim 1, wherein said heat transfer assembly comprises duct walls extending from said base member forming a flow duct extending from said fan receptacle to said inflow opening of said heat transfer chamber for said fan induced flow.

31. Heat transfer assembly according to claim 1, wherein said heat transfer chamber is open on a side opposite to said base member.

32. Heat transfer assembly according to claim 1, wherein said flow duct is open on a side opposite to said base member.

33. Heat transfer assembly according to claim 1, wherein said heat transfer assembly with said side walls of said heat transfer chamber and said duct walls of said flow duct extends to a common geometric surface arranged opposite to said base member.

34. Heat transfer assembly according to claim 33, wherein said heat transfer assembly is adapted to be mounted on a mounting surface with the geometric surface abutting said mounting surface.

35. Heat transfer assembly according to claim 33, wherein said fins extend at maximum to said geometric surface.

36. Heat transfer assembly according to claim 1, wherein said flow of cooling medium through said heat transfer chamber comprises a permanent environment induced flow and a need controlled fan induced flow.

37. Heat transfer assembly according to claim 1, wherein said fan is controlled by a fan controller detecting the temperature at the at least one power component and activating said fan depending on the temperature detected.

38. The heat transfer assembly of claim 1, wherein the environment induced flow is defined by the flow of cooling medium which is not aided by a fan or any external device.

39. A heat transfer assembly for cooling an electronic power circuitry, said heat transfer assembly comprising:
- a base member and at least one electronic power component in heat conductive contact for transferring heat to said base member;
- a heat transfer chamber adjoining said base member and being provided with fins extending from said base member into said heat transfer chamber for transferring heat to a flow of cooling medium, extending through said heat transfer chamber and passing through spaces between said fins;
- wherein said heat transfer assembly is designed such that said flow of cooling medium comprising an environment induced flow extending through said heat transfer chamber and entering said heat transfer chamber with respect to the direction of gravity in a lower section thereof and exiting from said heat transfer chamber with respect to said direction of gravity from an upper section thereof;
- wherein said heat transfer assembly is designed such that said flow of cooling medium can be supplemented by a fan induced flow extending through said heat transfer chamber and entering said heat transfer chamber in a location different from the location of entry of said environment induced flow;
- wherein the environment induced flow is generated by a chimney effect; and
- further comprising an inflow opening and an outflow opening, wherein the outflow opening is positioned higher than the inflow opening, with respect to the direction of gravity, such that the environment induced flow, from the inflow opening to the outflow opening, moves opposite to the direction of gravity.

* * * * *